United States Patent
Droz (10) Patent No.: US 7,785,932 B2
(45) Date of Patent: Aug. 31, 2010

(54) PLACEMENT METHOD OF AN ELECTRONIC MODULE ON A SUBSTRATE AND DEVICE PRODUCED BY SAID METHOD

(75) Inventor: François Droz, Corcelles (CH)

(73) Assignee: Nagraid S.A., Le Cret-du-Locle (CH)

( * ) Notice: Subject to any disclaimer, the term of this patent is extended or adjusted under 35 U.S.C. 154(b) by 411 days.

(21) Appl. No.: 11/342,911

(22) Filed: Jan. 30, 2006

(65) Prior Publication Data

US 2006/0172458 A1 Aug. 3, 2006

(30) Foreign Application Priority Data

Feb. 1, 2005 (EP) ................... 05100694
Sep. 30, 2005 (EP) ................... 05109094

(51) Int. Cl.
*H01L 21/00* (2006.01)

(52) U.S. Cl. ............... 438/127; 438/106; 438/121; 438/124; 257/E21.001

(58) Field of Classification Search ............... 438/106, 438/127; 257/E21.001
See application file for complete search history.

(56) References Cited

U.S. PATENT DOCUMENTS

| | | | | |
|---|---|---|---|---|
| 5,005,282 A | * | 4/1991 | Rose | 29/827 |
| 5,234,530 A | * | 8/1993 | Freeman, III | 156/358 |
| 5,406,699 A | * | 4/1995 | Oyama | 29/827 |
| 5,637,858 A | * | 6/1997 | Hoppe et al. | 235/492 |
| 5,852,289 A | * | 12/1998 | Masahiko | 235/492 |
| 6,038,133 A | * | 3/2000 | Nakatani et al. | 361/760 |
| 6,305,609 B1 | * | 10/2001 | Melzer et al. | 235/487 |
| 6,462,284 B1 | * | 10/2002 | Hashimoto | 174/260 |
| 6,974,724 B2 | * | 12/2005 | Hyvonen et al. | 438/107 |
| 7,038,310 B1 | * | 5/2006 | Nakatani et al. | 257/706 |

(Continued)

FOREIGN PATENT DOCUMENTS

EP 0 694 871 1/1996

(Continued)

*Primary Examiner*—Charles D Garber
*Assistant Examiner*—Angel Roman
(74) *Attorney, Agent, or Firm*—Sturm & Fix LLP

(57) ABSTRACT

The aim the disclosed process is to ensure maximum precision both at the level of the manufacturing of an electronic assembly from a chip with small dimensions as well as the level of the placement of such an assembly on an insulating substrate. This aim is achieved by a placement process on a support, called substrate, of at least one electronic assembly consisting of a chip including at least one electric contact on one of its faces, said contact being connected to a segment of conductive track, and said placement being carried out by means of a placement device holding and positioning said assembly on the substrate, comprising the following steps:

- formation of a segment of conductive track having a predetermined outline,
- transfer of the track segment onto the placement device,
- seizing of the chip with the placement device carrying the track segment in such a way that said track segment is placed on at least one contact of the chip.
- placement of the electronic assembly consisting of the chip and the track segment at a predetermined position on the substrate,
- embedding of the chip and of the track segment into the substrate.

A placement device used in the process and a portable object including an electronic assembly placed according to the process are also objects of the present invention.

16 Claims, 5 Drawing Sheets

U.S. PATENT DOCUMENTS

| | | | |
|---|---|---|---|
| 7,069,652 B2* | 7/2006 | Heinemann et al. | 29/852 |
| 7,128,272 B2* | 10/2006 | Doublet | 235/492 |
| 7,341,890 B2* | 3/2008 | Ishimaru et al. | 438/125 |
| 2003/0153120 A1* | 8/2003 | Halope | 438/106 |
| 2003/0180986 A1* | 9/2003 | Iizuka et al. | 438/107 |
| 2004/0194876 A1 | 10/2004 | Overmeyer | |
| 2005/0093172 A1* | 5/2005 | Tsukahara et al. | 257/778 |
| 2007/0141760 A1* | 6/2007 | Ferguson et al. | 438/127 |
| 2009/0115042 A1* | 5/2009 | Koyanagi | 257/686 |

FOREIGN PATENT DOCUMENTS

| | | |
|---|---|---|
| EP | 1 410 322 | 4/2004 |
| FR | 2 780 500 | 6/1998 |
| WO | WO 98/26372 | 6/1998 |
| WO | WO 98/44452 | 10/1998 |

\* cited by examiner

PLACEMENT METHOD OF AN ELECTRONIC MODULE ON A SUBSTRATE AND DEVICE PRODUCED BY SAID METHOD

TECHNICAL FIELD

The present invention concerns the field of assembly of transponders, chip cards, integrated circuits or other digital data support and more particularly the placement, mounting and connection of electronic assemblies on an insulating support, more commonly known as a substrate.

PRIOR ART

An electronic assembly means here a component in the form of a semi-conductive chip, provided on one of its faces with electric contact areas on which segments of conductive tracks are arranged for extending said contacts. These segments of track are connections linking the chip to external elements located on the substrate. For example, in a transponder, the track segments of the assembly are used for connecting it to the ends of an antenna arranged on the perimeter of the substrate.

There are several processes of placement and connection of a chip or an electronic assembly on a substrate including conductive tracks, namely.

The document EP0694871 describes a placement process of a chip carried out by means of a hot-pressing tool. The tool seizes the chip, with the face including the contacts directed upward, and then hot presses it into the substrate material. The face including the contacts is level with the surface of the substrate. The connections are produced using silk-screen printing or by track tracing by means of conductive ink that connects the contacts of the chip to an antenna, for example. According to an embodiment, a track segment is placed on the substrate and the chip is hot pressed with the face carrying the contacts directed towards the substrate in order to make a connection by pressing a contact of said chip on the track segment.

In the document WO98/26372, the chip includes contacts in relief and it is placed with the face carrying the contacts directed towards the substrate. The contacts of the chip are applied against conductive terminals of an antenna printed on the substrate. An intermediate plastic sheet is superimposed on the substrate equipped in this way and covers the chip. A second sheet covers the substrate before the hot lamination of this assembly of sheets. This process called the "flip chip" technique allows the placement and the connection of the chip to be carried out in one single operation and guarantees the minimal thickness of the assembly.

The document WO98/44452 describes a manufacturing process of a chip card comprising at least one microcircuit in the substrate of the card. The microcircuit is positioned in such a way that the output studs are directed upwards. Applying conductive ink with a syringe carries out the connection of the studs with the contacts of an antenna placed on the surface of the substrate. The microcircuit is placed at the bottom of a cavity that has a greater depth than the thickness of the microcircuit in order to leave a space that allows said microcircuit to be covered with resin after the connections have been carried out. The connections follow the profile of the microcircuit and the one of the cavity before reaching the contacts or tracks printed on the surface of the substrate.

In the process described in the document EP1410322, a complete module comprising a chip provided with contact areas is placed from a support strip on a substrate, including the printed conductive tracks, also arranged on a strip. A module among those fixed on the strip is placed face to a part of strip equipped with an assembly of conductive tracks that form, for example, an antenna. Then, it is separated from the strip in order to be adhered onto the substrate in the proximity of the terminals of the antenna. The connection of the contact areas of the module to the antenna is carried out by pressure and crimping with a suitable device during the gluing of the module.

The document FR2780534 describes a manufacturing process of an object including a body comprising a semi-conductive chip provided with contact areas on one of its faces and metallizations forming an antenna. The process consists in inserting the chip by hot pressing into a small board made of thermoplastic material. The face of the chip provided with contact areas is placed in such a way that it is level with one of the face of the board. The metallizations forming the antenna as well as the connections of the contact areas of the chip are made on the same face of the board by silk-screen printing of conductive ink.

This process becomes inapplicable when the dimensions of the semi-conductive chip are very small, of approximately a few tenths of a millimeter. In fact, silk-screening or the application of conductive material by another process (tracing, projection) does not allow the necessary precision to be achieved that prevents short circuits or the breaking of contacts at the level of the connection areas on the chip.

The main drawback of the aforementioned placement and connection processes is their lack of precision, especially when the dimensions of the chip forming the electronic assembly are notably reduced, for example 0.2 mm by 0.2 mm. Furthermore, the very small distance, of approximately 0.05 mm, that separates the track segments attached to the contacts of the chip, requires a high level of precision in terms of positioning and connection.

In the three first examples, only a chip or a microcircuit is placed on the substrate either with the contacts pressed on the tracks printed on one face of the substrate (flip-chip), or with the visible contacts connected subsequently. These two types of processes become rather unreliable when the size of the chip and the contacts reduces.

In the penultimate example, the modules are manufactured separately and arranged on a strip before being placed on the substrate. This process is also relatively slow and expensive.

SUMMARY OF THE INVENTION

The aim of the present invention is to ensure maximum precision both at the level of manufacturing an electronic assembly from a chip with small dimensions as well as at the level of the placement of this type of assembly on an insulating substrate. Another aim is to achieve a very low transponder production cost with a high manufacturing rate.

These aims are achieved by a placement process on a support, called substrate, of at least one electronic assembly consisting of a chip including at least one electric contact on one of its faces, said contact being connected to a segment of conductive track, and said placement being carried out by means of a placement device holding and positioning said assembly on the substrate, comprising the following steps:

formation of a segment of conductive track having a predetermined outline, transfer of the track segment onto the placement device, seizing of the chip with the placement device carrying the track segment in such a way that said track segment is placed on at least one contact of the chip.

placement of the electronic assembly consisting of the chip and the track segment at a predetermined position on the substrate, embedding of the chip and of the track segment into the substrate.

The term substrate here refers to any type of insulating support whether it is a card, a label, an object or a part of the structure of the object (apparatus shell, identification badge, box, package lining, document, etc.) likely to be equipped with an electronic assembly according to the process above.

According to a preferred embodiment, the track segment consists of a thin strip of any shape stamped from a sheet of conductive material with a stamping tool. It is then transferred onto the positioning device that holds it, for example, by means of an air suction device. In general, the number of stamped track segments corresponds to the number of contacts of the chip. They are held by the positioning device according to an arrangement depending on the positions of the contacts on the chip. Their shape and their individual dimensions are also determined by the configuration of the chip contacts as well as by the one of the conductive tracks of the substrate.

The track segments can also form a transponder antenna that works, for example in the domain of UHF frequencies (Ultra High Frequency). In one case, the end of the segment that is not connected to the chip remains free, that is to say without connection to other tracks on the substrate. According to another configuration, the segment forms a loop, with each end connected to the chip. Of course, the placing device can handle such a segment in the same way as a segment including only one end connected to the chip.

In this type of configuration, it is possible that the chip may include other contacts from which segments are connected to tracks or to contact surfaces arranged on the substrate.

The placement device whereon the track segments are fixed seizes a chip, also by means of suction according to one embodiment, the ends of the track segments being applied against the chip contacts. This assembly is then positioned and pressed on the foreseen place on the substrate and the free ends of the track segments connect to the terminals of a circuit present on the substrate (for example, an antenna).

The aim of this invention also consists in a placement device intended for positioning an electronic assembly on a substrate, said assembly comprising a chip provided with at least one electric contact connected to a conductive track segment, said device provided with means for positioning and pressing the electronic assembly onto the substrate comprises a head equipped with means for maintaining of at least one conductive track segment, and said maintenance means being connected to seizing and means for holding a chip so that the track segment is connected to at least one contact of the chip.

The means for holding the track segment are preferably made up of an air suction device that creates a vacuum on one of the faces of the track segment. A similar device can be also provided to pick up a chip with one end of the track segment being applied against a contact of the chip. The assembly thus mounted is transported towards a predetermined location on the substrate where it will be implanted. The placement device also includes means for pressing the assembly into the substrate.

One advantage of the invention is to avoid the production of an intermediate module due to the fact that the electronic assembly is assembled by means of the placement device before it is placed on the substrate.

The invention also refers to a portable object comprising on all or part of its structure an insulating substrate in which at least one electronic chip is embedded, said chip includes a face having at least one contact and said face is placed at the same level as the surface of the substrate, wherein at least one conductive track segment applied against the surface of the substrate is connected to the contact of the chip.

DESCRIPTION OF THE DRAWINGS

The invention will be better understood thanks to the detailed following description that refers to enclosed drawings, which are given as an non-limitative examples, in which.

DETAILED DESCRIPTION OF THE INVENTION

According to the process of the invention, each electronic assembly is mounted before its placement and connection with other elements present on the substrate. The track segments (3, 3'), which number usually corresponds to the number of contacts (5, 5') of the chip (4), are cut from a sheet (2) of conductive material and are then assembled on these contacts (5, 5').

Figure 1:
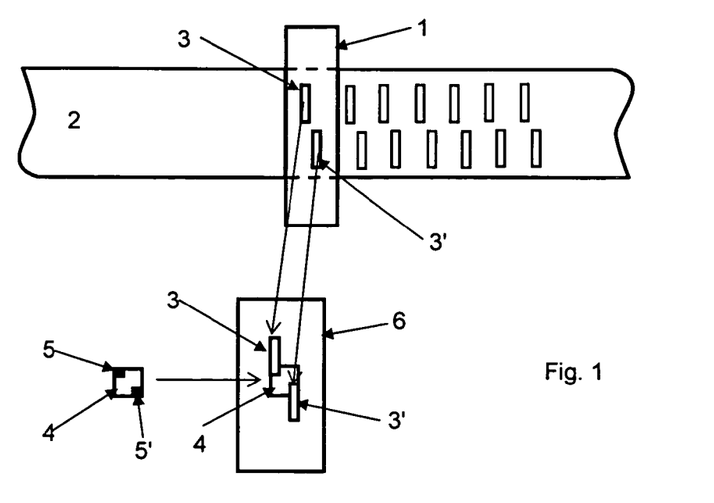
FIG. 1 shows the stamping of the track segments from a strip of conductive material and a transparent schematic top view of the placement device holding a chip and the track segments.

FIG. 1 shows an example of a pair of rectangular track segments (3, 3') arranged in a staggered way stamped in a sheet (2) or a copper strip originating from a roll, for example. The stamping tool (1) operates here from bottom to top and pushes the cut segments (3, 3') towards its upper surface in such a way as to be transferred easily onto the placement device (6). The latter is placed above the stamping tool (1) and sucks the segments (3, 3') up by holding them in the same position than during stamping. An electronic chip (4) is then seized by the placement device (6) that carries the segments (3, 3') in such a way that its contacts (5, 5') touch the nearest ends of each segment (3, 3') in a central area of the head of the placement device (6). The chip (4) is also held on the device by suction in a similar way to track segments (3, 3').

Figure 4:
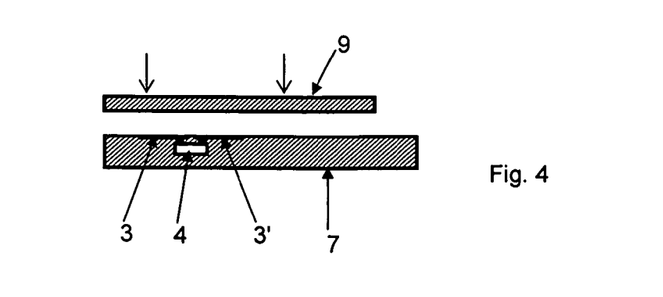
FIG. 4 shows an enlarged section view of the part of the substrate in FIG. 3.

The assembly thus formed held by the placement device (6) is then positioned and subsequently hot pressed, for example, into a substrate (7) by the same device. The contact surface of the assembly that is directed upwards is level with the surface of the substrate (7) as shown in the section view of FIG. 4 and the track segments (3, 3') are placed flat against the surface of the substrate (7).

Figure 3:
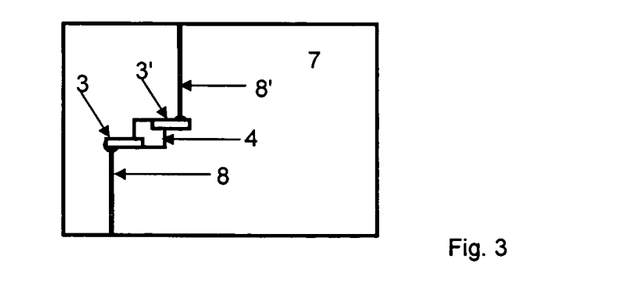
FIG. 3 shows a top view of a part of substrate where the assembly is placed and connected to printed tracks.

The free ends of the segments (3, 3') are connected by exerting pressure on the appropriate terminals which are formed with conductive tracks (8, 8') arranged on the substrate (7), see FIG. 3.

In a final step of the assembly, an insulating protection sheet (9) is laminated, according to a known technique, on all or part of the surface of the substrate (7) ensuring the final mechanical holding of the electronic assembly made up of the track segments (3, 3') and the chip (4), the electric connections having been made previously.

This placement process is applied advantageously, for example, during the manufacturing of transponders or of contactless chip cards where the electronic assembly is connected, for example, to the ends of an antenna.

Figure 2:
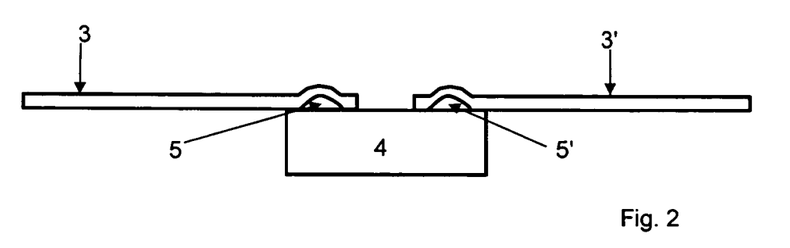
FIG. 2 shows an enlarged section view of the electronic assembly consisting of the chip and the track segments.

FIG. 2 shows the section view of an assembly consisting of a chip (4) comprising two contacts (5, 5') each provided with a bump. The connection of the track segments (3, 3') is carried out by exerting pressure in such a way that the bumps achieve the electric contact with the conductive material of the segment. The bumps can also be made of a conductive material that is fusible at a relatively low temperature (tin based alloy, for example) so that the placement device carries out the connection of the track segments with heat supply.

When the melting point of the bumps material is higher, such as for example in the case of gold, an optimal electric contact is ensured by supplementary weld spots, for example by laser, ultrasound or also by thermo-compression. These welding operations can be carried out either with the placement device during or after the embedding of the electronic assembly in the substrate (7) or during a supplementary step after the placement of the electronic assembly. Another possibility consists in using a welding device separate from the placement device in order to weld, during a previous step, the conductive segment(s) (3, 3') with the contacts (5, 5') of the chip (4) at a high temperature. The chip-segments assembly is then transferred onto the placement device that places said assembly on the substrate (7) for embedding it at a lower temperature adapted to the softening of the substrate, for example. Due to the high temperature of the welding device, this placement operation becomes difficult to carry out with only one device executing both the welding and the placement without damaging the substrate.

According to an embodiment, the connection of the track segments (3, 3') on the contacts (5, 5') of the chip (4) can be carried out through the application of a conductive adhesive on these contacts (5, 5') before the placement device (6 seizes the chip (4). Another possibility consists in applying the conductive adhesive to the end of the segments (3, 3') facing the contacts (5, 5') of the chip (4). This operation is carried out during a step prior to the transfer of the segment (3, 3') onto the placement device (6) before or after its stamping. The adhesive can also be applied previously in an inactive form on the conductive sheet and then subsequently activated. The adhesion of the contacts (5, 5') of the chip (4) with the track segments (3, 3') is thus carried out during the seizing of the chip (4) by the placement device (6) then during or after the embedding step of the chip-segments assembly into the substrate (7).

Figure 5:
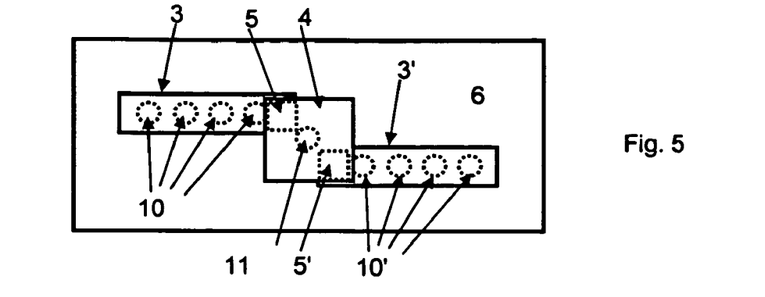
FIG. 5 shows a schematic bottom view of the head of the placement device holding the track segments and the chip.

FIG. 5 represents a schematic bottom view of the head of the placement device (6) according to the invention provided with openings (10, 10', 11) intended to hold, by means of air suction (vacuum), the different elements of the electronic assembly. In a first step, the air suction through the openings (10, 10') allows the reception of the track segments (3, 3') on the stamping tool (1) and holds them and in position. In a second step, the chip (4) is seized from a suitable support also by means of air suction through a central orifice (11). The electronic assembly built in this way and held by the placement device is finally transported towards the location provided on the substrate (7) and pressed into the material. The head of the placement device (6) can be made up of either several pieces assembled together or of only one block providing a global support to the stamping tool, to the suction system of the segments and the chip, to the welding means etc. according to one example of configuration.

Figure 6:
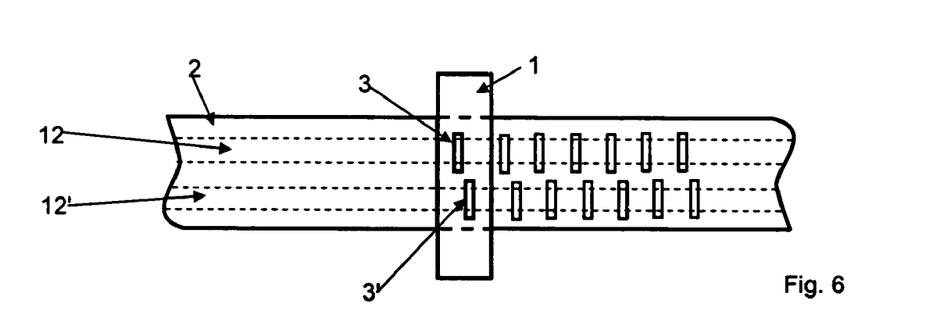
FIG. 6 shows an embodiment where the track segments are stamped from a conductive strip provided with insulating areas.
Figure 7:
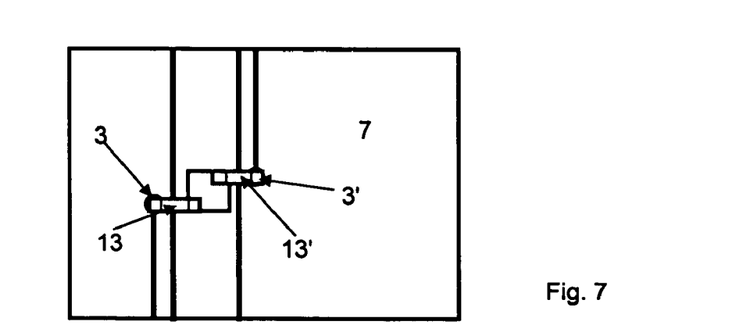
FIG. 7 shows a top view f of a part of the substrate where the track segments of the assembly provided with insulating areas cross and/or superimpose other tracks of the substrate.

FIG. 6 shows an embodiment wherein the conductive strip (2) on which the track segments (3, 3') are stamped is provided with insulating areas (12, 12') applied against the lower face of the strip. These areas (12, 12') are arranged in order to form a central insulated part (13, 13'), on the face that will be applied against the substrate, of each segment stamped from this strip (2). The ends of the segments (3, 3') are released from the insulating area in order to ensure the connections with the chip (4) and the conductive tracks or areas of the substrate (7) provided for that purpose. This isolation prevents short-circuits with the tracks (8, 8') of the substrate (7) that the segments cross in certain configurations, as shown in FIG. 7.

According to one embodiment, the insulating areas on the segments can be carried out from insulating segments obtained in a similar way to the conductive segments, but from an insulating film. These segments are transferred onto the placement device on which they are held against the appropriate track segments before the placement and embedding of the assembly in the substrate. This alternative allows the production of insulating segments of any shape and namely wider than the conductive segments in order to ensure improved isolation of a track crossing, for example (see the example in FIG. 17)

Figure 8:
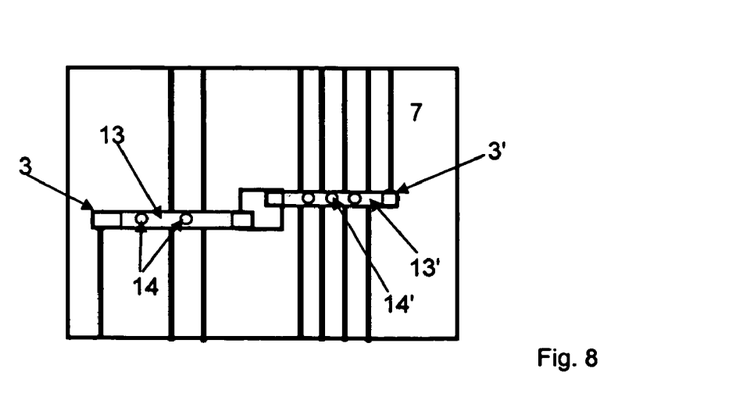
FIG. 8 shows a top view of a part of the substrate where the track segments of the assembly are longer and provided with insulating areas. They are adhered onto the substrate and cross the tracks.

According to another embodiment shown in FIG. 8, and in case the segments (3, 3') are longer, the insulating film of the conductive strip (2) can comprise an adhesive layer. The adhesive, once activated, ensures the holding of the segment on the substrate when it crosses several tracks, for example. The adhesive layer can also be arranged on the substrate (7) instead of being applied on the insulating film.

During the placement of the assembly, the segments (3, 3') are adhered onto the substrate (7), for example, thanks to the activation by localized heating of the adhesive layer by the placement device (6) at points (14, 14') facing the insulating area. These points (14, 14') are preferably situated outside the tracks of the substrate (7) thus allowing improved adhesion.

According to one embodiment, the same device carries out the stamping operations of the segments (3, 3') of conductive tracks and the placement of the assembly. In this case, the head of the device is completed with a stamp for cutting out the track segments (3, 3'). A withdrawal of the stamp allows the suction openings (10, 10') to hold the segments (3, 3') in a suitable position before the seizing of the chip (4). The transfer step of the track segments (3, 3') from the stamping tool towards the placement device is therefore eliminated.

According to another embodiment, the means for seizing and holding the chip comprise adhesive elements that replace the opening(s) (11) in the central area of the placement device (6). The chip (4) is therefore adhered temporarily between its contacts (5, 5') during the transport of the electronic assembly towards its location on the substrate (7). The adhesive elements have a weaker adhesive force than that of the fixing of the chip (4) on the substrate (7) in order to allow the withdrawal of the placement device (6) after the embedding of the electronic assembly. The adhesive can remain on the chip (4) after having been placed with the aim of improving the flatness of the surface of the electronic assembly in case the chip (4) includes contacts (5, 5') with bumps.

It should be noted that adhesive elements conductive according to a vertical axis (axis Z) can also be added onto the placement device (6) facing the contacts of the chip (4). These elements can either replace the adhesive elements or the suction opening(s) (vacuum) of the central area, or complete them.

According to a further embodiment, the head of the placement device (6) can include means for welding the track segments (3, 3') onto the contacts of the chip (4). These welding means consist of, for example, a laser or ultrasonic source or one or several heat elements. In general, they are activated before or during the placement or during or after the embedding of the electronic assembly in the substrate (7) in order to exert the necessary pressure on the elements to be welded.

The process according to the invention also applies to the manufacturing of smart cards or transponders comprising substrate that is not thermo-fusible, namely a substrate that will not melt or soften when the temperature is raised. The substrate can be made up of a material based on cellulose such as paper or cardboard. In this case, it is preferable to create a cavity in which the chip will be placed provided with its track segments. The cavity can be executed by milling or embedding of a die after the previous softening of the substrate with solvents with or without elevation of the temperature. The electronic assembly can also be cold or hot pressed directly into the material that is locally deformed or in an area made malleable in order to absorb the volume of the chip. The aim of the process, as in the case of thermo-fusible substrates, is to preserve precise positioning without clearance, which means without possibility of movement of the assembly inside the cavity. Of course, such a cavity for cavity the chip can also be formed in a thermo-fusible substrate whereon localized heating can facilitate the embedding and the holding of the chip in the cavity.

Tests with certain non thermo-fusible substrates have shown that a direct embedding process using hot pressing of the assembly can cause the combustion of the material of the substrate at the position of the chip, creating thus the cavity. In this case, the previous formation of the cavity is no longer necessary.

Figure 9:
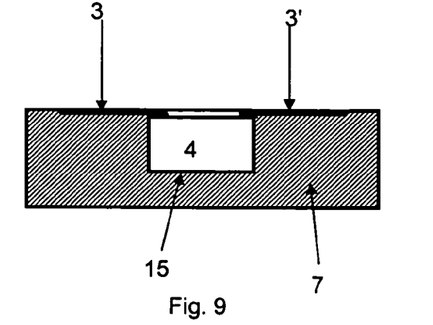
FIG. 9 shows an enlarged section view of a part of the substrate where the chip-segments assembly is embedded in the substrate.

Several embodiments of the process disclosed in FIGS. 9 to 14 can be presented according to the material or the structure of the substrate or according to the equipment available, namely:

FIG. 9 shows the simplest embodiment in which the chip-segments assembly is directly embedded in the material of the substrate (7) either hot or cold with providing solvents. In certain cases, in order to facilitate the placement of the assembly, a cavity (15) is formed in the substrate (7) with dimensions that are slightly smaller or equal to those of the chip (4). The depth of the cavity (15) corresponds approximately to the thickness of the chip (4) so that the face including the segments (3, 3') is level with the surface of the substrate (7). This cavity (15) is preferably created during a step prior to the placement of the chip-segments assembly with the placement device (6). The latter embeds or inserts the assembly into the cavity (15) in which it is held thanks to the similarity of the dimensions of the cavity (15) and the chip (4). In order to reduce the embedding pressure, it is also possible to soften locally the periphery of the cavity (15) with appropriate solvents.

Figure 10:
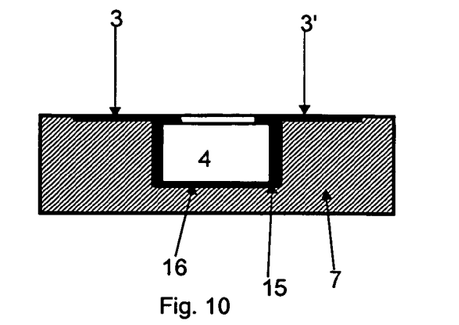
FIG. 10 shows an enlarged section view of a part of substrate including a cavity with dimensions larger than those of the chip, the chip-segments assembly is held in the cavity thanks to an adhesive that fills the free spaces.

FIG. 10 shows the case in which the dimensions of the cavity (15) are larger than those of the chip (4) with a depth corresponding approximately to the thickness of the chip (4). In this case a substance, preferably adhesive (16), such as for example, a thermo-fusible, thermo-hardening, or ultra-violet light photo-hardening resin or any other suitable adhesive, is applied into the cavity (15). The placement device (6) then embeds the chip (4) in the adhesive substance (16) that is distributed and discharged into the free space left along the outline of the chip (4). This filling allows the holding of the chip-segments assembly in a stable position after the hardening of the adhesive substance (16).

Figure 11:
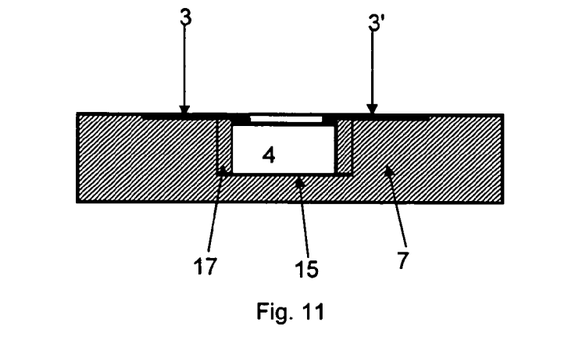
FIG. 11 shows an enlarged section view of a part of a substrate including a cavity with a depth lower than the height of the chip. The substrate material fills the free spaces during the embedding of the chip-segments assembly into the cavity.

FIG. 11 shows the case wherein the depth of the cavity (15) is lower than the thickness of the chip (4) and with dimensions that are larger than those of the chip (4). The placement device (6) embeds the chip so that the face of the chip (4) including the segments (3, 3') is level with the surface of the substrate (7). In order to ensure leveling without excessive deformation of the substrate (7), the latter can be softened (solvents or heating) at the level of the cavity (15) also allowing the discharge (17) of the material of the substrate (7) in the free space surrounding the chip (4). This space filled in this way holds the position of the chip-segments assembly in the cavity (15).

This embodiment of the process can be combined with the previous one by adding an adhesive substance (16) in the cavity disclosed in FIG. 11 in order to complete the filling of the space according to the dimensions of this cavity (15) compared to those of the chip (4).

Figure 12:
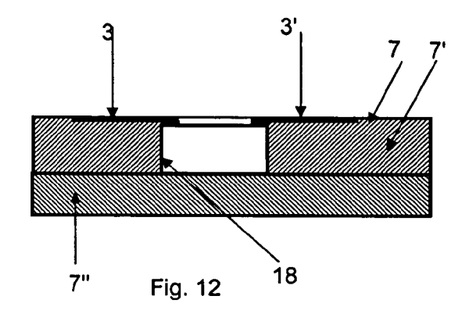
FIG. 12 shows an enlarged section view of a part of the substrate formed by two superimposed layers, the upper layer includes a window with dimensions approximately equal to those of the chip, the chip-segments assembly being embedded in the window.
Figure 13:
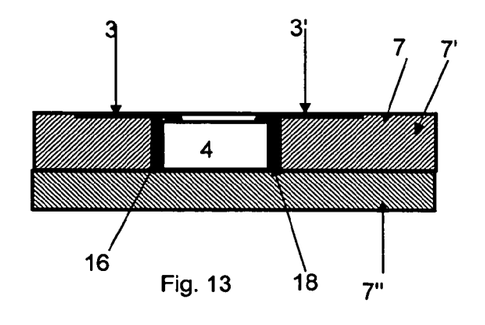
FIG. 13 shows an enlarged section view of a part of the substrate formed by two superimposed layers, the upper layer includes a window with larger dimensions than those of the chip, the chip-segments assembly is held in the cavity thanks to an adhesive that fills the free spaces.
Figure 14:
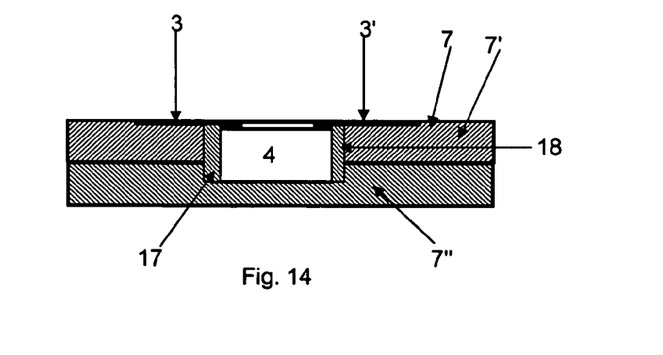
FIG. 14 shows an enlarged section view of a part of a substrate formed by two superimposed layers, the upper layer having a thickness lower than the height of the chip includes a window. The material of the lower layer of the substrate fills the free spaces during the embedding of the chip-segments assembly into the window.

FIGS. 12 to 14 show one embodiment in which the substrate (7) is formed by two superimposed layers (7', 7") placed one on top of the other. The upper layer (7') includes a window (18), namely a perforation through the entire thickness of this layer (7'). In general, the window (18) is carried out by stamping the upper layer (7') of the substrate before the placement of the lower layer (7"). The lower face of the window (18) is closed with the lower layer (7") of the substrate (7) in order to form a cavity holding the chip (4) in an accurate position. The laminating of both layers of the substrate is carried out during a subsequent step after the placement of the electronic assembly in the cavity.

FIG. 12 shows the embodiment wherein the dimensions of the window (18) are smaller or equal to those of the chip (4) and the thickness of this layer (7') is equivalent to that of the chip (4). As in the embodiment in FIG. 9, the chip (4) is embedded in the window (18) and is held directly by the walls of the window (18). The face of the chip (4) including the segments (3, 3') is level with the surface of the upper layer (7') of the substrate (7).

FIG. 13 shows the embodiment wherein the dimensions of the window (18) are larger than those of the chip (4) and the thickness of the upper layer (7') corresponds approximately to that of the chip (4). As in the embodiment in FIG. 10, an adhesive substance (16) is applied in the cavity formed by the window (18) in order to fill the space surrounding the chip (4) when the latter is placed in window (18) and embedded in adhesive substance (16).

The embodiments of FIGS. 12 and 13, wherein the thickness of the substrate including the window is similar to that of the chip, can also be presented without the lower substrate. The chip is held either by the edges of the window or by an adhesive substance that fills the space between the edges of the window and the chip. Supplementary protection layers can also be added to the substrate during further steps in order to cover one or both faces of the window.

FIG. 14 shows the embodiment wherein the thickness of the upper layer (7') of the substrate is smaller than that of the chip (4) with the dimensions of the window (18) being larger than those of the chip (4). In this case, as in that of FIG. 11, the chip (4) is embedded across the window (18) and then in the lower layer (7") of the substrate (7) that is softened in such a way as to discharge the material (17) of this layer (7") along the outline of the chip (4). The space filled in this way around the chip (4) allows the latter to be held in the window (18).

Similarly to the embodiments of FIGS. 10 and 11, the embodiments of FIGS. 13 and 14 can be combined. An adhesive substance (16) can be added in the cavity shown in FIG. 14 in order to complete the filling of the free space around the chip (4) according to the dimensions of the latter compared to those of the window (18).

Figure 15:
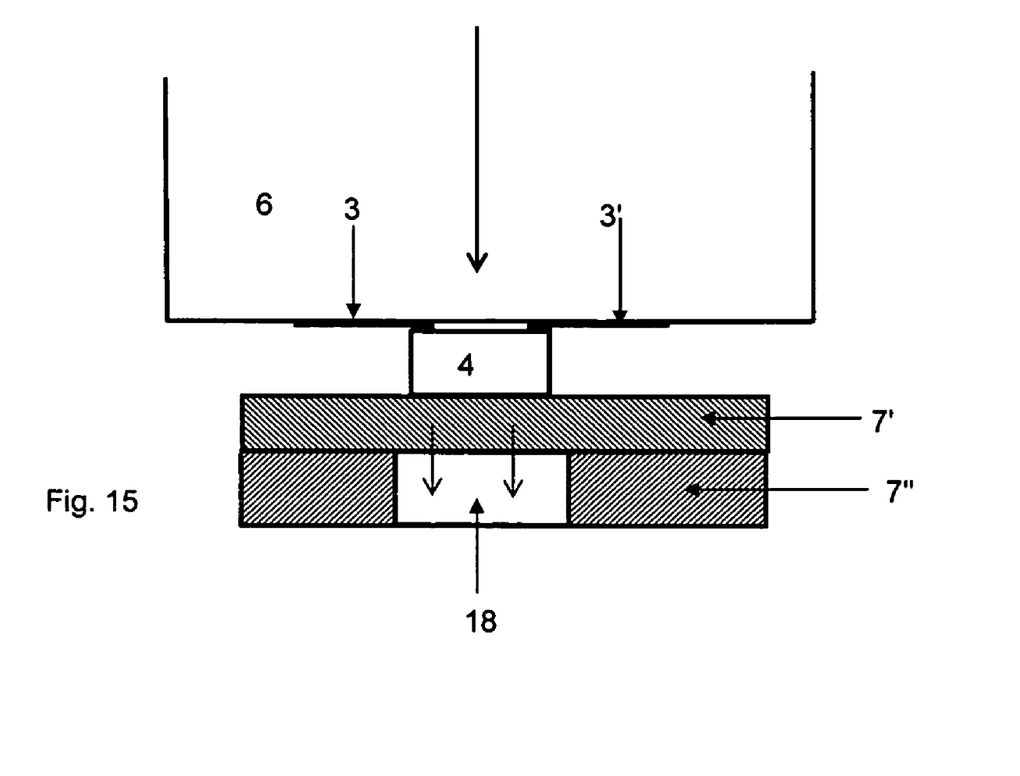
FIG. 15 shows an enlarged section view of a part of the substrate formed by two superimposed layers, the lower layer includes a window. The chip-segments assembly is embedded into the upper layer facing the window of the lower layer.
Figure 16:
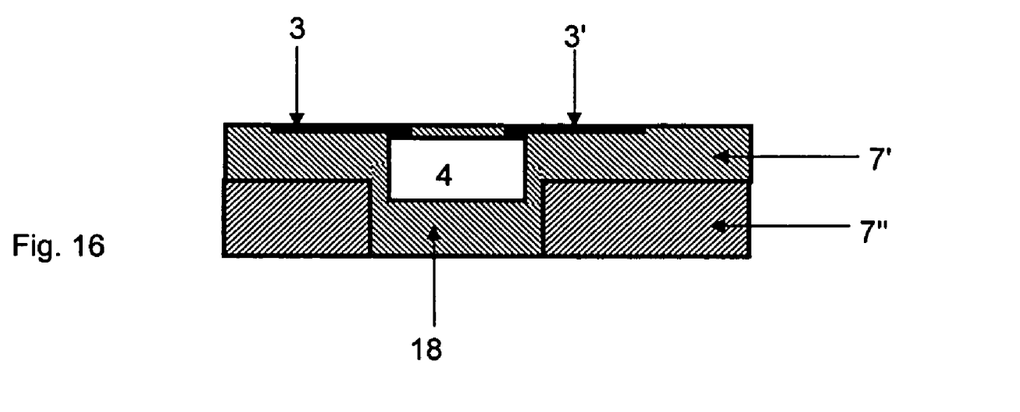
FIG. 16 shows the section view in FIG. 15 with the chip-segments assembly embedded in the upper layer and the material of said layer fills the window of the lower layer.

FIGS. 15 and 16 show embodiments with a substrate (7) in two layers where the window (18) is cut into the lower layer (7") of the substrate (7). The assembly of chip (4) segments (3, 3') is embedded in the upper layer (7') facing to the window (18) of the lower layer (7") with the placement device (6). The pressure exerted by the placement device (6) allows the softened material of the upper layer (7') to be discharged into the window (18) as shown in FIG. 16. The segments (3, 3') are level with the surface of the upper layer (7') as in the embodiments in FIGS. 9 to 14.

The dimensions of the window (18) and the thickness of the layers (7', 7") of the substrate (7) are also determined by the volume of material necessary to fill the window without allowing the appearance, on the surface of the substrate (7), of a depression or a bump which could harm the application of the assembly of chip (4) segments (3, 3') integrated into the substrate (7).

Figure 17:
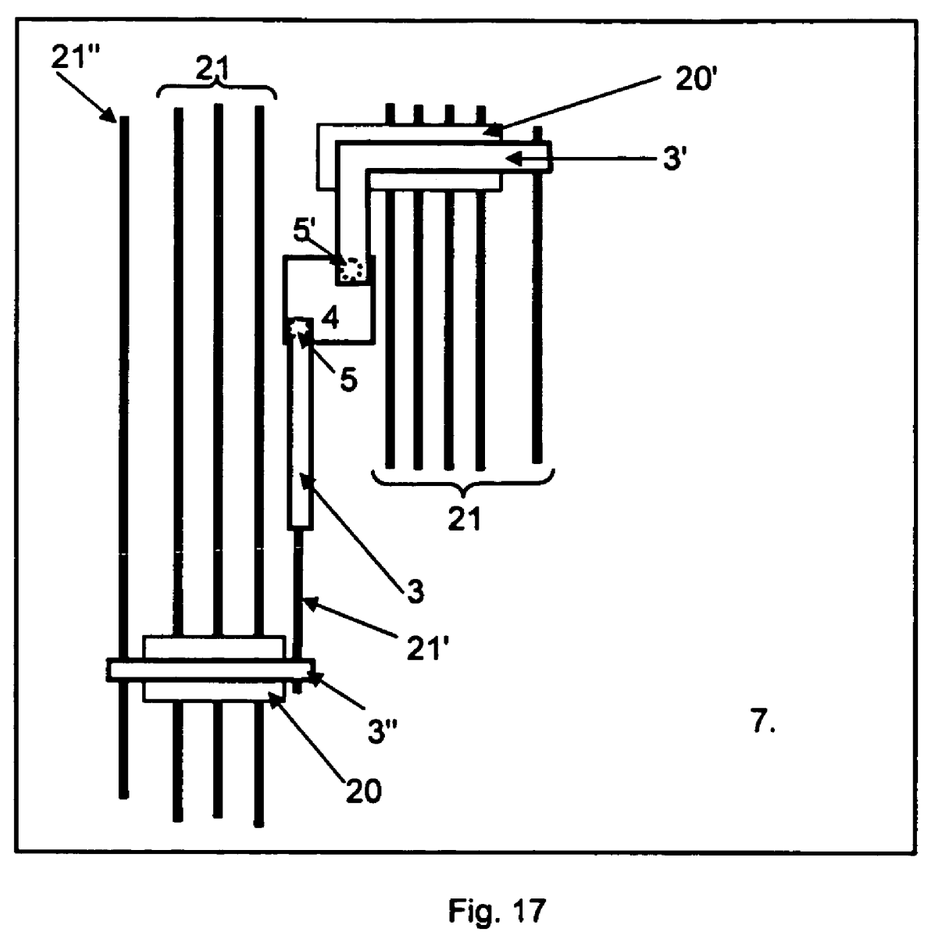
FIG. 17 shows a part of the substrate comprising a chip-segments assembly with segments crossing the conductive tracks by passing over insulating segments.

FIG. 17 shows an example of an embodiment carried out according to the process of this invention. The part of the substrate (7) includes a chip (4) provided with contacts (5, 5) each connected to one end of a conductive segment (3, 3'). The other end of each conductive segment (3, 3') is connected to conductive tracks (21, 21') arranged on the substrate (7). The first segment (3') originating from the chip crosses a set of conductive tracks (21) passing over a first insulating segment (20'). The second conductive segment (3) of the chip (4) is connected on one end of a track (21'). This track (21') is connected to a third conductive segment (3") leading to a distant track (21") passing over a second insulating segment (20) covering a set of tracks (21).

The placement process of these different elements (conductive, insulating segments and chip) is summarized as follows:

stamping of the three conductive segments (3, 3', 3") and seizing by the placement device (6), stamping of two insulating segments (20, 20') and seizing by the placement device (6), seizing of the chip (4) so that its contacts (5, 5') face the ends of the conductive segments (3, 3') previously seized and to which ends they will be connected during the step of embedding into the substrate (7).

placement in a predetermined position on the substrate (7) and embedding of all the seized elements in such a way that the face of the chip including the contacts as well as the conductive and insulating segments are level with the surface of the substrate.

The invention claimed is:

1. A process of placement on a substrate, of at least one electronic assembly comprising a chip provided with at least one conductive track segment indented to be connected to a contact on a face of the chip, the process comprising the steps of:

forming in a sheet of conductive material at least one conductive track segment having a predetermined outline;

seizing and holding only the conductive material forming the conductive track segment previously formed with a placement device;

seizing the chip with the placement device holding the conductive track segment so that the electronic assembly is built on the placement device with a portion of said conductive track segment positioned facing or applied against a contact of the chip;

placing, by the placement device, the electronic assembly previously built, at a predetermined position relative to the substrate, the chip and the conductive track segment being held together by said placement device;

embedding by the placement device said electronic assembly into the substrate.

2. A process according to claim 1 wherein the embedding of the chip and of the conductive track segment into the substrate ensures the electric connection between the contact of the chip and the conductive track segment.

3. A process according to claim 1 wherein an operation of welding the conductive track segment onto the contact of the chip is carried out either with the placement device during or after the embedding of the electronic assembly into the substrate, or during a supplementary step preceding the embedding of the electronic assembly into the substrate.

4. A process according to claim 3 wherein the supplementary step comprises using a welding device separate from the placement device for welding the conductive track segment onto the contacts of the chip, the electronic assembly then being transferred onto the placement device for placement on the substrate and embedding.

5. A process according to claim 1 including a step for applying conductive adhesive on the contacts of the chip prior to the seizing of said chip by the placement device.

6. A process according to claim 1 including a step for applying conductive adhesive on the end of the conductive track segment facing the contact of the chip prior to the transfer of said conductive track segment onto the placement device.

7. A process according to claim 1 wherein the conductive track segment is obtained by cutting out a sheet of conductive material and transferring it onto the placement device that holds it.

8. A process according to claim 1 wherein an insulating segment is obtained from an insulating film and then transferred onto the placement device that holds it against the conductive track segment, said insulating segment forming an insulating area on the conductive track segment.

9. A process according to claim 1 wherein the face of the chip provided with the contact is directed towards the placement device during the seizing process, said contact being placed facing one end of the conductive track segment held by said placement device.

10. A process according to claim 1 wherein the assembly is placed in such a way that the surface of the chip provided with the contacts is level with the surface of the substrate, and wherein the conductive track segment is applied against the surface of the substrate.

11. A process according to claim 7 wherein the sheet of conductive material includes an insulating film applied against its lower face.

12. A according to claim 11 wherein the conductive track segment is obtained from said sheet in order to be provided with an insulating area on the central part of its lower face intended to be applied against the substrate, the ends of said conductive track segment being released from the insulating area.

13. A process according to claim 11 wherein the insulating film is coated with adhesive.

14. A process according to claim 13 wherein the placement device, during the placement of the assembly on the substrate, heats the conductive track segment at points positioned facing the insulating area leading to the activation of the adhesive and the holding of the conductive track segment on the substrate.

15. A process according to claim 1 including a preliminary step of forming, into the substrate, of a cavity for fitting the chip of the electronic assembly.

16. A according to claim 15 including a step of softening the substrate at the level of said cavity prior to the embedding of the chip into the cavity so that the face of said chip carrying the conductive track segments is level with the surface of the substrate the dimensions of the cavity being equivalent to those of the chip and the depth of said cavity corresponding approximately to the thickness of the chip.

* * * * *